United States Patent
Ma et al.

(10) Patent No.: US 7,825,496 B2
(45) Date of Patent: Nov. 2, 2010

(54) SEMICONDUCTOR DEVICE HAVING A FILLING PATTERN AROUND A STORAGE STRUCTURE AND METHOD OF FORMING THE SAME

(75) Inventors: Jong-Wan Ma, Suwon-si (KR); Joon-Mo Kwon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/292,673

(22) Filed: Nov. 24, 2008

(65) Prior Publication Data
US 2009/0134525 A1 May 28, 2009

(30) Foreign Application Priority Data
Nov. 23, 2007 (KR) .................. 10-2007-0120185

(51) Int. Cl.
*H01L 29/06* (2006.01)
(52) U.S. Cl. ...................... 257/622; 257/758
(58) Field of Classification Search ............. 257/774, 257/622, 758; 438/629, 672, 675
See application file for complete search history.

(56) References Cited

U.S. PATENT DOCUMENTS 6,235,593 B1 *  5/2001  Huang ................. 438/279
6,255,686 B1 *  7/2001  Takeuchi et al. ............ 257/306
2005/0275109 A1 * 12/2005  Kuan et al. .................. 257/758

FOREIGN PATENT DOCUMENTS

| JP | 11-168199 A | 6/1999 |
| KR | 10-2001-0003048 A | 1/2001 |
| KR | 10-2001-0046511 A | 6/2001 |
| KR | 10-2003-0001117 A | 1/2003 |
| KR | 10-2004-0059822 A | 7/2004 |
| KR | 10-0699915 B1 | 3/2007 |

* cited by examiner

*Primary Examiner*—S. V Clark
(74) *Attorney, Agent, or Firm*—Lee & Morse, P.C.

(57) ABSTRACT

A semiconductor device includes an interlayer insulating layer on a semiconductor substrate, at least one plug on the semiconductor substrate, the plug extending through the interlayer insulating layer toward an upper portion of the semiconductor substrate, the plug having a lower part with a first diameter and an upper part with a second diameter different from the first diameter, a filling pattern on the interlayer insulating layer, the filling pattern surrounding the upper part of the plug, and an upper surface of the filling pattern being substantially coplanar with an upper surface of the plug, the upper surface of the plug facing away from the semiconductor substrate, and a protection pattern on the upper part of the plug, the protection pattern being between the plug, the filling pattern, and the interlayer insulating layer.

17 Claims, 8 Drawing Sheets

SEMICONDUCTOR DEVICE HAVING A FILLING PATTERN AROUND A STORAGE STRUCTURE AND METHOD OF FORMING THE SAME

BACKGROUND

1. Field of the Invention

Example embodiments relate to a semiconductor device and a method of forming the same. More particularly, example embodiments relate to a semiconductor device having a filling pattern around a storage structure and a method of forming the same.

2. Description of the Related Art

A semiconductor device may include a storage structure, e.g., a storage electrode, and a plug supporting the storage structure. When the semiconductor device is fabricated using a smaller design rule according to high integration density, e.g., to meet a requirement for geometrically reducing sizes of the plug and storage structure, the semiconductor device may have a reduced alignment margin between the storage structure and the plug. The reduced alignment margin between the storage structure and the plug may deteriorate electrical characteristics of the semiconductor device, e.g., cause a short circuit between the storage structure and a bit line adjacent to the storage structure.

SUMMARY

Example embodiments are therefore directed to a semiconductor device and a method of manufacturing the same, which substantially overcome one or more of the disadvantages of the related art.

It is therefore a feature of an example embodiment to provide a semiconductor device including a filling pattern around a storage structure capable of preventing a short circuit between the storage structure and an adjacent interconnection.

It is another feature of an example embodiment to provide a semiconductor device including a filling pattern around a storage structure capable of increasing an alignment margin between the storage structure and a plug by surrounding the plug in contact with the storage structure.

It is yet another feature of an example embodiment to provide a method of forming a semiconductor device including one or more of the above features.

At least one of the above and other features and advantages may be realized by providing a semiconductor device, including an interlayer insulating layer on a semiconductor substrate, at least one plug on the semiconductor substrate, the plug extending through the interlayer insulating layer toward an upper portion of the semiconductor substrate, the plug having a lower part with a first diameter and an upper part with a second diameter different from the first diameter, a filling pattern on the interlayer insulating layer, the filling pattern surrounding the upper part of the plug, and an upper surface of the filling pattern being substantially coplanar with an upper surface of the plug, the upper surface of the plug facing away from the semiconductor substrate, and a protection pattern on the upper part of the plug, the protection pattern being between the plug and the filling pattern with the interlayer insulating layer.

The second diameter may be larger than the first diameter, the plug including a conductive material and being electrically connected to the semiconductor substrate. The protection pattern and the filling pattern may include a different insulating material from the interlayer insulating layer and the plug. The semiconductor device may further include a storage structure on the plug and connected thereto, the storage structure being in contact with the plug and extending upward from the plug, a vertical center axis of the storage structure being horizontally spaced apart from a vertical center axis of the plug. The storage structure may include a conductive material, a phase change material, a ferromagnetic material, a paramagnetic material, or stacked layers thereof.

The semiconductor device may further include a lower interconnection on the semiconductor substrate, the lower interconnection being between the semiconductor substrate and the plug, a landing pad between the plug and the lower interconnection, the landing pad being in contact with the semiconductor substrate and the lower interconnection, and an upper interconnection above the lower interconnection and perpendicular thereto, wherein the filling pattern overlaps the upper and lower interconnections, the upper interconnection, landing pad, and lower interconnection being covered with the interlayer insulating layer. Upper surfaces of the upper interconnection and filling pattern may be substantially coplanar. The landing pad may include a conductive material, and each of the lower and upper interconnections may include a conductive material and an insulating material sequentially stacked. The filling pattern may be between the storage structure and the upper interconnection The semiconductor device may further include a device isolation region defining at least one active region on the semiconductor substrate, the plug being electrically connected to the active region. The filling pattern may overlap the device isolation region and the at least one active region. The filling pattern may be only on the device isolation region.

When the plug is a plurality of plugs, the filling pattern may surround an upper part of each plug of the plurality of plugs. The protection pattern may be directly on the upper part of each plug, the filling pattern extending between protection patterns of adjacent plugs and in direct contact therewith. Upper surfaces of the filling pattern, plug, and protection pattern may be substantially coplanar. The protection pattern may be in direct contact with the plug, the filling pattern, and the interlayer insulating layer. The filling pattern may surround an entire perimeter of the plug, the filling pattern overlapping only an upper section of the upper part of the plug. The filling pattern and the interlayer insulating layer may be discrete elements. The filling pattern and the interlayer insulating layer may include different materials.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Korean Patent Application No. 10-2007-0120185, filed Nov. 23, 2007, in the Korean Intellectual Property Office, and entitled: "Semiconductor Device Having Filling Pattern Around Storage Structure and Method of Forming the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Like reference numerals refer to like elements throughout.

Further, it will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first interlayer insulating layer discussed below could also be termed a second interlayer insulating layer without departing from the teachings of the exemplary embodiments, and a second interlayer insulating layer could be termed a first interlayer insulating layer. Spatially relative terms, such as "upper", "lower", "around", "over", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Figure 1:
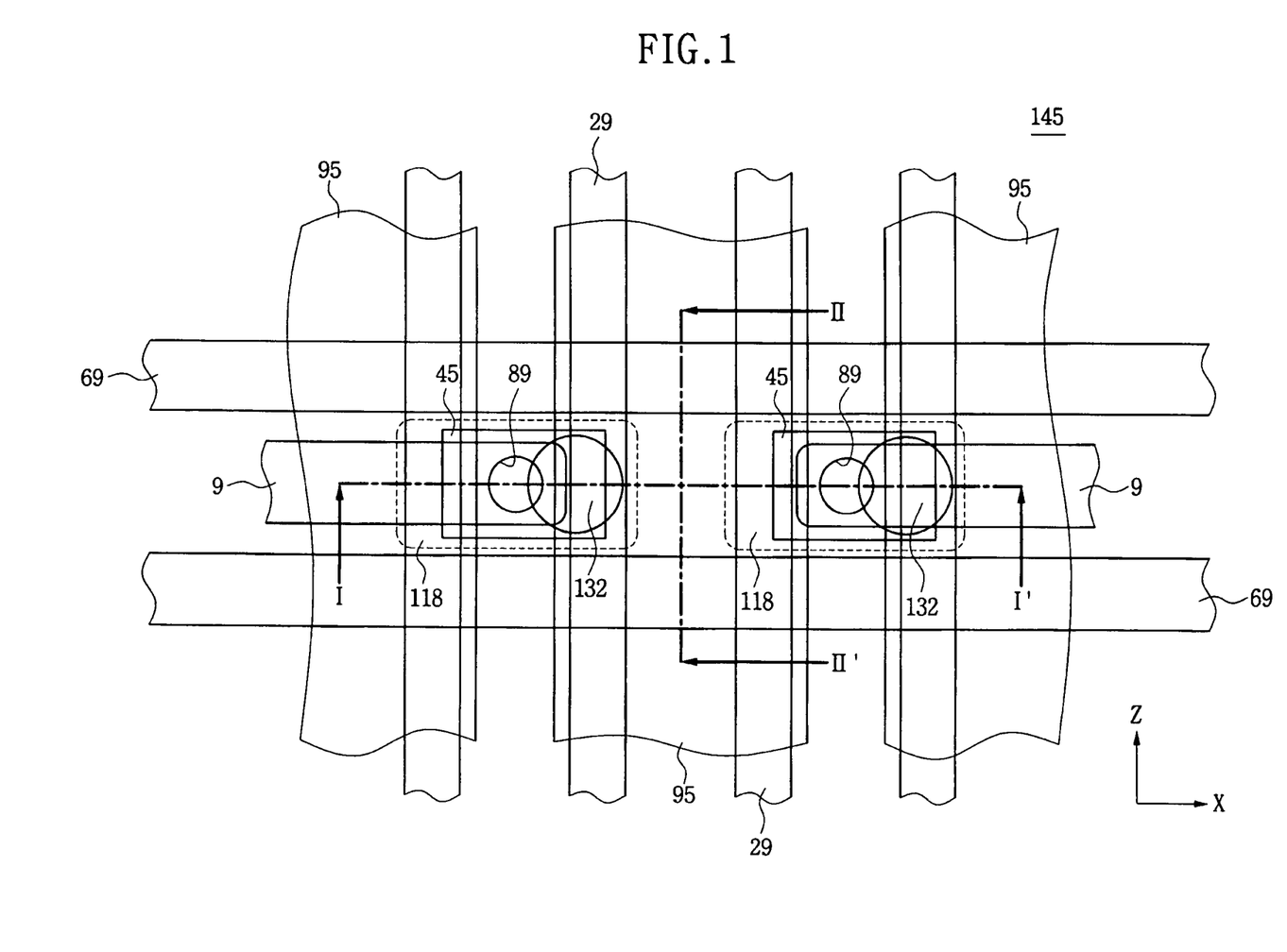
FIG. 1 illustrates a plan view of a semiconductor device according to an example embodiment.

Now, a semiconductor device having a filling pattern around a storage structure according to example embodiments will be described in detail with reference to FIGS. 1 and 2. FIG. 1 illustrates a plan view of a semiconductor device according to an example embodiment, and FIG. 2 illustrates cross-sectional views along lines I-I' and II-II' of FIG. 1.

Figure 2:
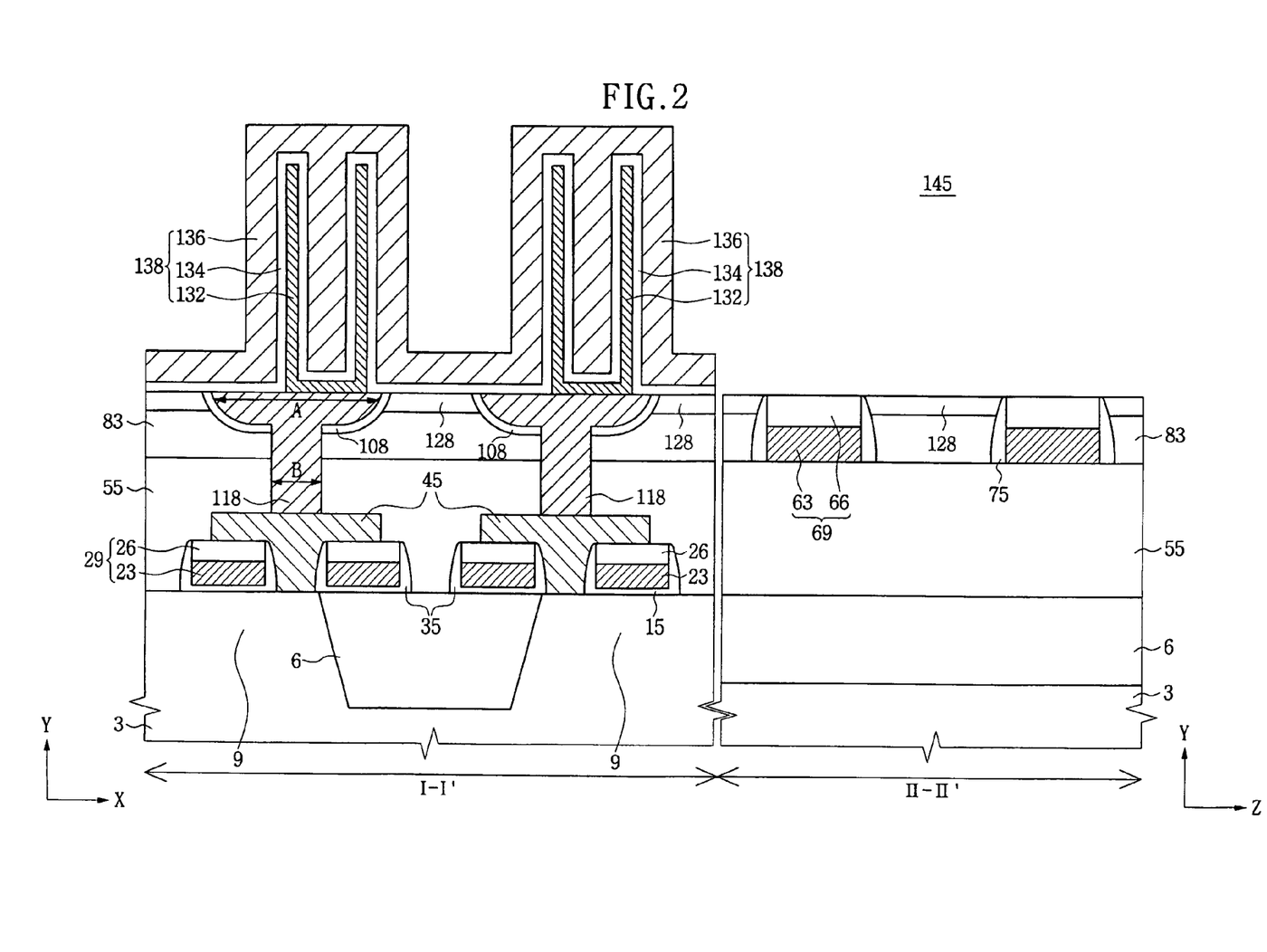
FIG. 2 illustrates cross-sectional views along lines I-I' and II-II' of FIG. 1.

Referring to FIGS. 1 and 2, a semiconductor device 145 may include lower interconnections 29 along a first direction, e.g., along the z-axis, on a semiconductor substrate 3, a first interlayer insulating layer 55 on the lower interconnections 29, upper interconnections 69 along a second direction, e.g., along the x-axis, on the first interlayer insulating layer 55, a second interlayer insulating layer 83 on the first interlayer insulating layer 55, a filling pattern 128 on the second interlayer insulating layer 83, and a plurality of plugs 118 through the first and second interlayer insulating layers 55 and 83 and through the filling pattern 128. It is noted that for ease and clarity of explanation, only two plugs 118 adjacent to each other are illustrated in FIGS. 1-2.

The plug 118 may be disposed on the semiconductor substrate 3 to be electrically connected to the semiconductor substrate 3. The plug 118 may extend upward from the semiconductor substrate 3, as illustrated in FIG. 2. As further illustrated in FIG. 2, the plug 118 may have a first diameter A at an upper part thereof and a second diameter B at a lower part thereof. The first diameter A may be larger than the second diameter B. More specifically, the plug 118 may include a linear portion extending from the semiconductor substrate 3 upward along a vertical direction, e.g., along the y-axis, and a horizontal portion extending from the linear portion. For example, as illustrated in FIG. 2, a cross section of the vertical and horizontal portions of the plug 118 may be T-shaped. The linear portion of the plug 118 may have the first diameter A as measured along the second direction, e.g., along the x-axis. The horizontal portion of the plug 118 may extend horizontally, e.g., along the x-axis, or radially from the linear portion, so the horizontal portion may have the second diameter B, as measured along the second direction. In this respect, it is noted that the second diameter B may be measured at an upper surface of the plug 118, i.e., a surface facing away from the semiconductor substrate 3.

A second interlayer insulating layer 83 may be disposed on the semiconductor substrate 3 to surround the plugs 118, as illustrated in FIG. 2. As further illustrated in FIG. 2, an upper surface of the second interlayer insulating layer 83 may be disposed at a lower height than upper surfaces of the plugs 118, so a vertical distance, i.e., along the y-axis, between the upper surface of the second interlayer insulating layer 83 and the semiconductor substrate 3 may be smaller than a vertical distance between the upper surfaces of the plugs 118 and the semiconductor substrate 3. In this respect, it is noted that the upper surfaces of the second interlayer insulating layer 83 and the plugs 118 refer to surfaces in a plane parallel to the semiconductor substrate 3, e.g., surface in the xz-plane, and facing away from the semiconductor substrate 3.

As further illustrated in FIG. 2, the filling pattern 128 may be disposed on the upper surface of the second interlayer insulating layer 83, e.g., directly on the second interlayer insulating layer 83, to surround an upper portion of each plug 118. For example, the filling pattern 128 may surround only an upper portion of the horizontal portion of the plug 118, so the second interlayer insulating layer 83 may surround the linear portion of the plug 118 and a lower portion of the horizontal portion of the plug 118. Upper surfaces of the filling patterns 128 may be substantially coplanar with the upper surfaces of the plugs 118.

The semiconductor device 145 may further include a protection pattern 108 adjacent to the upper portion of the plug 118, as illustrated in FIG. 2. The protection pattern 108 may be interposed between the second interlayer insulating layer 83, the plug 118, and the filling patterns 128. For example, as illustrated in FIG. 2, the protection pattern 108 may conformally cover a portion of the horizontal portion of the plug 118, i.e., a surface of the horizontal portion facing the semiconductor substrate 3, so the protection pattern 108 may separate the horizontal portion of the plug 118 from the filling pattern 128 and from the second interlayer insulating layer 83. An upper surface of the protection pattern 108 may be substantially coplanar with the upper surfaces of the filing pattern 128 and the plug 118.

As illustrated in FIG. 2, a storage structure 138 may be disposed on the plug 118. The storage structure 138 may be in contact with the plug 118, e.g., the storage structure 138 may be in direct contact with the plug 118. The storage structure 138 may extend upward, i.e., along the y-axis, from the upper surface of the plug 118. A vertical center axis of the storage structure 138, i.e., an axis along the y-axis, may be spaced apart from a vertical center axis of a respective plug 118. For example, as illustrated in FIG. 2, the vertical center axis of the storage structure 138 may be offset horizontally, i.e., along the x-axis, from the vertical center axis of the plug 118. The storage structure 138 may include upper and lower electrodes 132 and 136, respectively, and a dielectric layer 134 between the upper and lower electrodes 132 and 136. The storage structure 138 may include a conductive material, a phase change material, a ferromagnetic material, a paramagnetic material, or stacked material thereof. When the semiconductor device 145 includes a plurality of plugs 118, e.g., three plugs 118 or more, the semiconductor device 145 may include a corresponding number of storage structures 138, so each storage structure 138 may be on a corresponding plug 118.

As illustrated in FIG. 2, the first interlayer insulating layer 55 may be on the semiconductor substrate 3, so the first interlayer insulating layer 55 may be between the semiconductor substrate 3 and the second interlayer insulating layer 83. For example, the first interlayer insulating layer 55 may be directly on the semiconductor substrate 3, and may surround portions of the plug 118, e.g., a part of the linear portion of the plug 118.

The upper interconnections 69 may be disposed on the first interlayer insulating layer 55, and may extend along the x-axis, as illustrated in FIGS. 1-2. The upper interconnections 69 may have a linear shape, and may be spaced apart from each other. Portions of the second interlayer insulating layer 83 may be positioned on the first interlayer insulating layer 55 between adjacent upper interconnections 69. For example, the upper interconnections 69 may be surrounded by the second interlayer insulating layer 83 and by the filling patterns 128 on the second interlayer insulating layer 83, so upper surfaces of the filling pattern 128 and the upper interconnection 69 may be substantially coplanar. As illustrated in FIGS. 1 and 2, the upper interconnections 69 may be disposed around the lower parts of the plugs 118. Each of the upper interconnections 69 may have a conductive material 63 and an insulating material 66, which may be sequentially stacked. If the semiconductor device 145 includes three or more of the plugs 118, the upper interconnections 69 may be disposed in three or more around the lower parts of the plugs 118. As illustrated in FIG. 2, upper spacers 75 may be disposed on sidewalls of the upper interconnections 69 to contact the second interlayer insulating layer 83 and the filling patterns 128. For example, a portion of the filling pattern 128 may be between the plug 118 and an upper spacer 75 adjacent to the plug 118 along the z-axis, and another portion of the filling pattern 128 may be on the first interlayer insulating layer 55 at a predetermined region between facing upper spacers 75 of adjacent upper interconnection 69. For example, the upper interconnection 69 may function as bit lines.

As illustrated in FIGS. 1 and 2, the semiconductor device 145 may further include a landing pad 45 under the plug 118. For example, each plug 118 may be positioned directly on a respective landing pad 45, so the landing pads 45 may be disposed between the plug 118 and the semiconductor substrate 3. The landing pad 45 may be in contact, e.g., direct contact, with the semiconductor substrate 3. When the semiconductor device 145 includes, e.g., three or more plugs 118, the semiconductor device 145 may include three or more landing pads 45 corresponding to the plugs 118, i.e., one landing pad 45 corresponding to each plug 118.

The lower interconnections 29 may be disposed along sides of the landing pads 45, e.g., along the z-axis, as illustrated in FIGS. 1 and 2. Each of the lower interconnections 29 may have a conductive material 23 and an insulating material 26, which may be sequentially stacked. For example, the lower interconnections 29 and the upper interconnections 69 may overlap the filling patterns 128. The lower interconnections 29, the landing pads 45 and the upper interconnections 69 may be covered with the first interlayer insulating layer 55. The lower and upper interconnections 29 and 69 may be disposed to cross each other on the semiconductor substrate 3, as illustrated in FIGS. 1 and 2. When the semiconductor device 145 includes, e.g., three or more plugs 118, the lower interconnections 29 may be disposed in three or more to correspond to the plugs 118. Sidewalls of the lower interconnections 29 may be covered with lower spacers 35, as illustrated in FIG. 2.

The semiconductor device 145 may further include a device isolation region 6 in the semiconductor substrate 3 to define active regions 9, as illustrated in FIGS. 1-2. The device isolation region 6 may be filled with an insulating material. The respective active regions 9 may correspond to the plugs 118. When the semiconductor device 145 includes, e.g., three or more plugs 118, the device isolation region 6 may be formed to define a corresponding number, i.e., three or more, of active regions 9 corresponding to the plugs 118. The device isolation region 6 and the active regions 9 may overlap the filling patterns 128.

Next, a method of forming a semiconductor device having a filling pattern around a storage structure according to an example embodiment will be described below with reference to FIGS. 3-8. FIGS. 3-8 illustrate cross-sectional views of sequential stages in a method of forming the semiconductor device of FIG. 1. Each of FIGS. 3-8 illustrates a cross-sections along lines I-I' and II-II' of FIG. 1.

Figure 3:
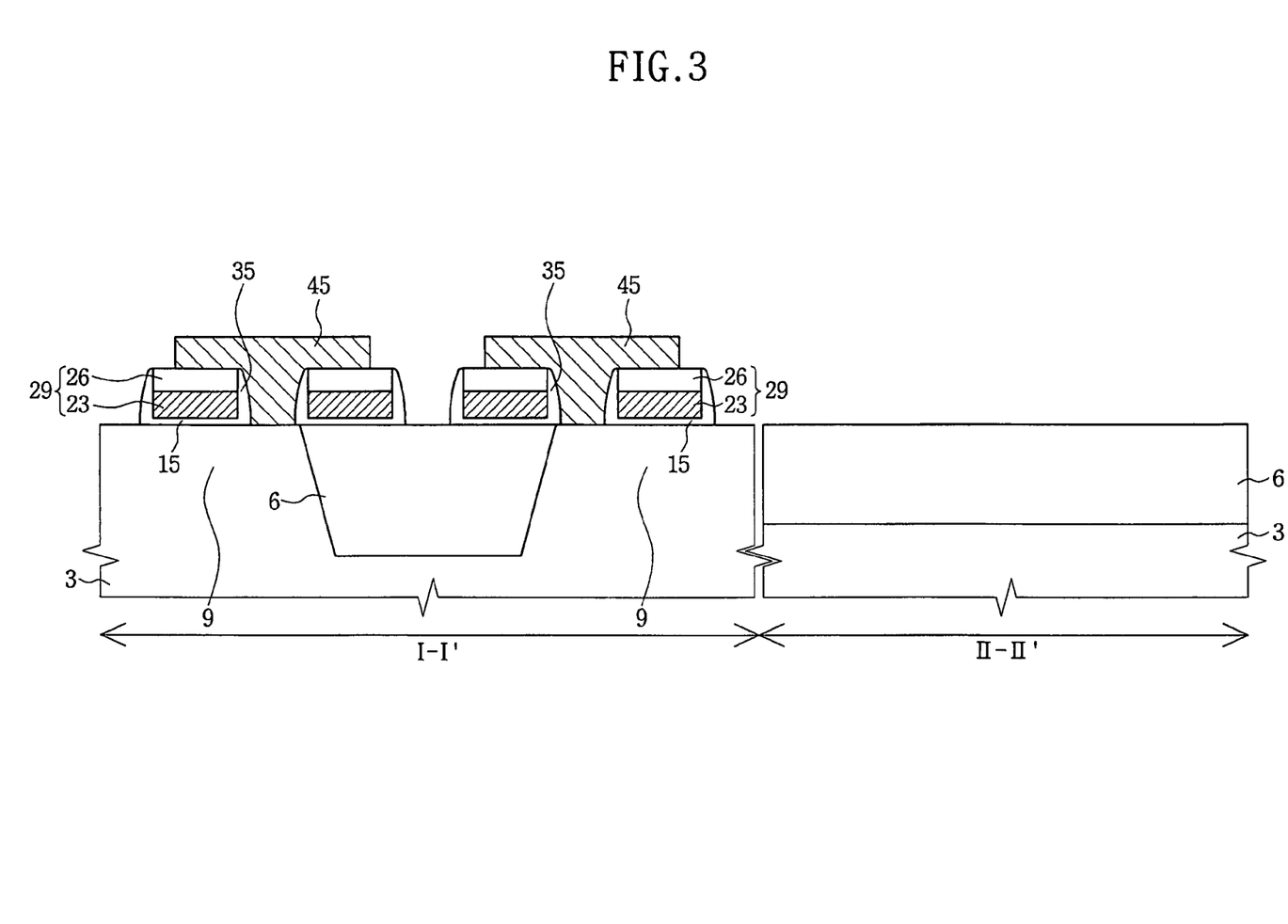
FIGS. 3-8 illustrate cross-sectional views along lines I-I' and II-II' of FIG. 1 in a method of forming a semiconductor device according to an example embodiment.

Referring to FIGS. 1 and 3, the device isolation region 6 may be formed in a semiconductor substrate 3. The device isolation region 6 may include an insulating material, and may be formed in the semiconductor substrate 3 to define the active regions 9, e.g., two or more active regions 9. The lower interconnections 29 may be formed on the semiconductor substrate 3 along the z-axis, so some lower interconnections 29 may overlap the device isolation region 6 and some lower interconnections 29 may overlap the active regions 9, as illustrated in FIGS. 1 and 3. The lower interconnections 29 may be formed by sequentially stacking a conductive material 23 and an insulating material 26 on the semiconductor substrate 3. The conductive material 23 of each lower interconnection 29 may extend toward a lower portion of the semiconductor substrate 3 through an upper surface of the semiconductor substrate 3. The lower interconnections 29 may function as gate patterns or word line patterns. When the device isolation region 6 defines three or more active regions 9, the semiconductor device 145 may include six or more lower interconnections 29 to correspond to the three or more active regions 9.

A gate insulating layer 15 may be disposed between the lower interconnections 29 and the semiconductor substrate 3, as illustrated in FIG. 3. The gate insulating layer 15 may include the same material as or a different material from the device isolation region 6. The gate insulating layer 15 may electrically insulate the lower interconnections 29 from the semiconductor substrate 3. Lower spacers 35 may be formed on sidewalls of the lower interconnections 29, as further illustrated in FIG. 3. The lower spacers 35 may include the same material as or a different material from the gate insulating layer 15. The lower spacers 35 may include a substantially same material as the insulating material 26 in the lower interconnection 29.

Landing pads 45 may be formed among the lower interconnections 29, as illustrated in FIGS. 1 and 3. For example, a landing pad 45 pad may have a T-shaped cross section in the xy-plane, so the landing pad 45 may have a vertical portion on the semiconductor substrate 3 between two adjacent lower interconnections 29 and a horizontal portion on the vertical portion connecting upper surfaces of the two adjacent lower interconnections 29. The landing pads 45 may include a conductive material. When the device isolation region 6 defines three or more active regions 9, the landing pads 45 may be formed in three or more to correspond to the three or more active regions 9.

Figure 4:
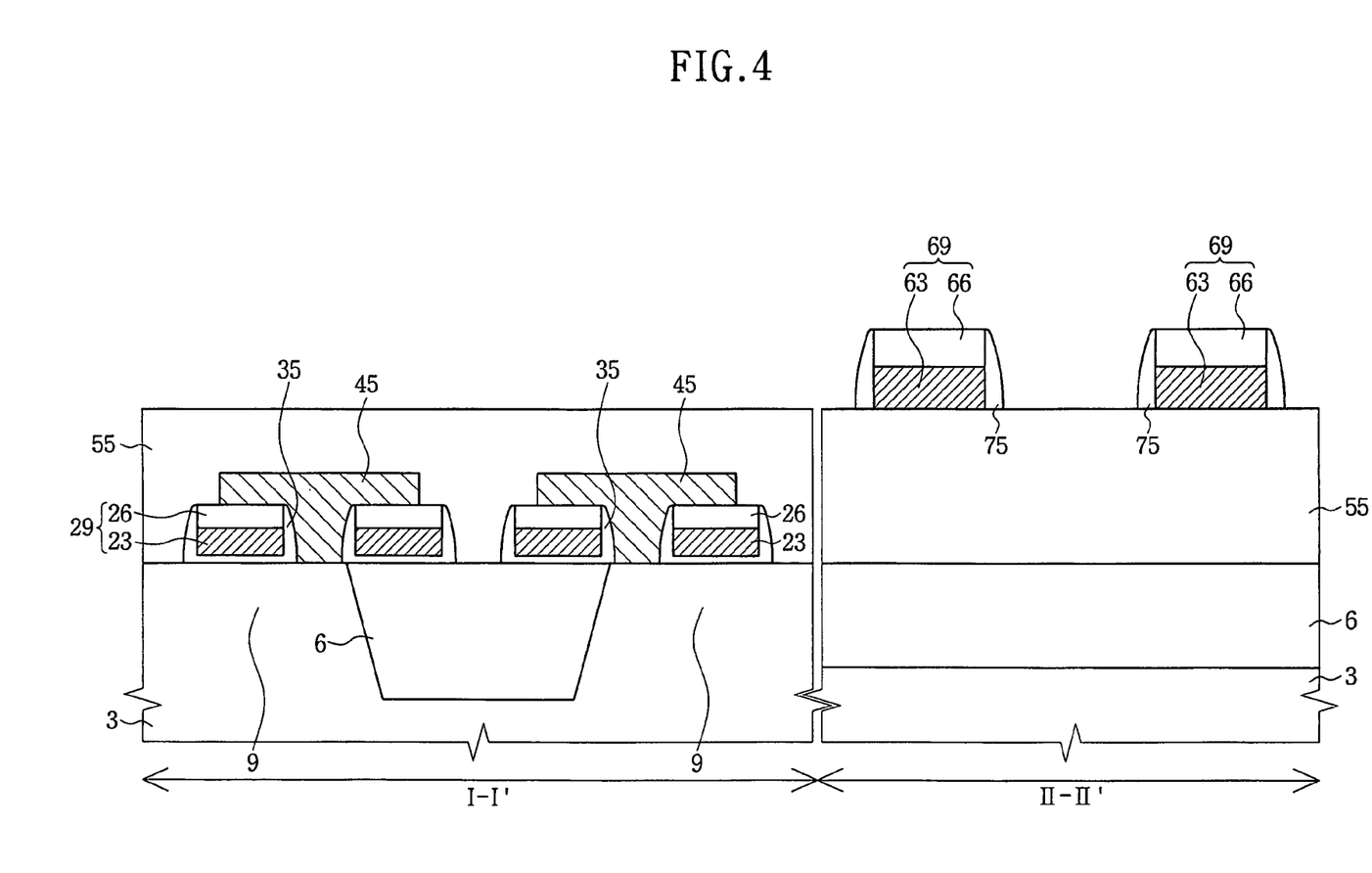

Referring to FIGS. 1 and 4, the first interlayer insulating layer 55 may be formed on the semiconductor substrate 3 to cover the landing pads 45 and the lower interconnections 29, e.g., the first interlayer insulating layer 55 may be formed on the device isolation region 6 and the active regions 9 to cover the lower interconnections 29 and the lower spacers 35. The first interlayer insulating layer 55 may be formed of a substantially same material as or a different material from the lower spacers 35.

The upper interconnections 69 may be formed on the first interlayer insulating layer 55, as illustrated in FIGS. 1 and 4. For example, the conductive material 63 and insulating material 66 of the upper interconnections 69 may be sequentially stacked on the first interlayer insulating layer 55. The upper interconnections 69 may be a digit line or bit line pattern. For example, if the semiconductor device 145 includes a plurality of landing pads 45 arranged in an array along the x-axis, as illustrated in FIG. 1, two upper interconnections 69 may be arranged to extend along the x-axis to have the array therebetween, as further illustrated in FIG. 1. When the device isolation region 6 defines three or more active regions 9, the upper interconnections 69 may be formed in two or more to correspond to the three or more active regions 9, or in three or more to correspond to the three or more active regions 9. The upper spacers 75 may be formed on sidewalls of the upper interconnections 69, as illustrated in FIG. 4. The upper spacers 75 may include the same insulating material 66 as each upper interconnection 69. The upper spacers 75 may include the same material as the lower spacers 35.

Figure 5:
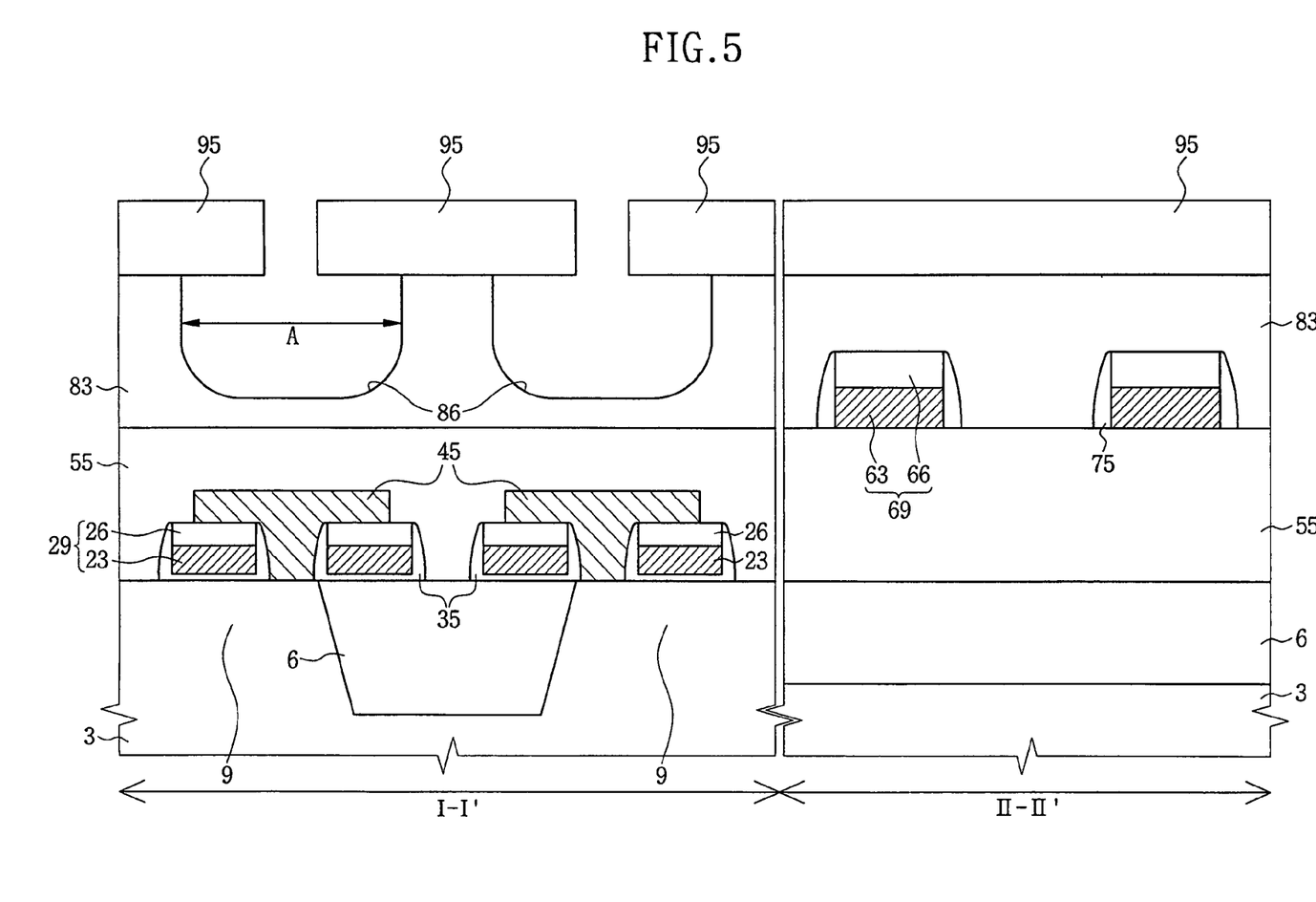

Referring to FIGS. 1 and 5, the second interlayer insulating layer 83 may be formed on the first interlayer insulating layer 55 to cover the upper interconnections 69 and the upper spacers 75. The second interlayer insulating layer 83 may include the same material as or a different material from the first interlayer insulating layer 55. Next, mask patterns 95 may be formed on the second interlayer insulating layer 83, as illustrated in FIGS. 1 and 5.

The mask patterns 95 may be arranged along a direction parallel to the direction of the lower interconnections 29, as illustrated in FIG. 1, so one mask pattern 95 may overlap two adjacent lower interconnections 29, i.e., adjacent lower interconnections 29 not connected to each other via a landing pad 45. The mask patterns 95 may be spaced apart from each other along the x-axis, so a space between adjacent mask patterns 95 may overlap a first portion of a respective landing pad 45, i.e., a portion centered between adjacent lower interconnections 29. In other words, spaces between adjacent mask patterns 95 may expose predetermined regions between adjacent lower interconnections 29 disposed on the device isolation region 6 and the active region 9, i.e., adjacent lower interconnection 29 connected by a landing pad 45. A distance between adjacent mask patterns 95 along the x-axis may substantially equal a distance between adjacent lower interconnections 29 in the active region 9 along the x-axis, i.e., distance other than in the device isolation region 6. The mask patterns 95 may include a different material from the second interlayer insulating layer 83. The mask patterns 95 may be formed of an insulating material and/or a conductive material. When the device isolation region 6 defines three or more active regions 9, the mask patterns 95 may be formed to correspond to the three or more active regions 9.

Next, as illustrated in FIG. 5, the second interlayer insulating layer 83 may be anisotropically etched, e.g., using dry or wet etchant, through the spaces between adjacent mask patterns 95, i.e., the mask patterns 95 may be used as an etch mask, to form enlarged grooves in the second interlayer insulating layer 83. For example, portions of the second interlayer insulating layer 83 exposed by the mask patterns 95 and portions directly under the mask patterns 95 may be removed to form cavities 86 in the second interlayer insulating layer 83. The cavity 86 may have the first diameter A as measured along the x-axis between facing sidewalls of the cavity 86. A vertical center axis of the cavity 86, i.e., an axis along the y-axis, may be formed to be the same as a vertical center axis of a corresponding landing pad 45, i.e., a landing pad 45 directly below the cavity 86. The cavity 86 may be formed to expose the upper interconnections 69, i.e., lower surfaces of cavity 86 may be formed at a lower height, e.g., closer to the semiconductor substrate 3 along the y-axis, than those of the upper interconnections 69. When the device isolation region 6 defines three or more active regions 9, the cavities 86 may be formed to correspond to the three or more active regions 9.

Figure 6:
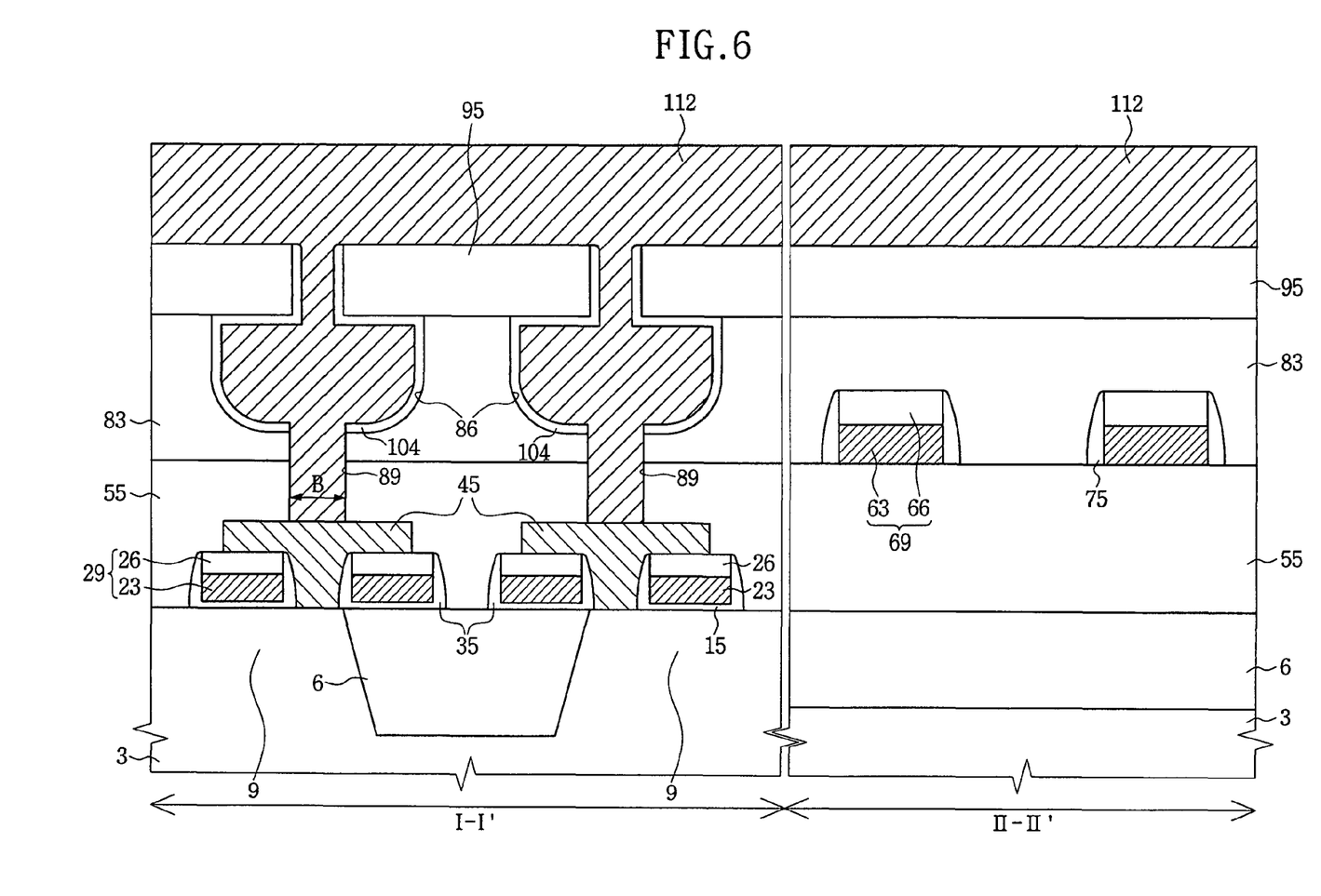

Referring to FIGS. 1 and 6, a protection layer 104 may be formed on the second interlayer insulating layer 83 and the mask patterns 95, e.g., to conformally cover inner surfaces of the cavity 86 and surfaces of the mask patterns 95. The protection layer 104 may include the same material as or a different material from the mask patterns 95. Next, connection holes 89 may be formed through the first and second interlayer insulating layers 55 and 83 using the mask patterns 95 and the protection layer 104 as an etch mask and/or an etch buffer layer, as illustrated in FIGS. 1 and 6. The connection holes 89 may extend along the y-axis from a bottom of the cavities 86 to respective landing pads 45, so upper surfaces of the landing pads 45 may be exposed through the first and second interlayer insulating layers 55 and 83. The connection holes 89 may have the second diameters B along the x-axis as measured between facing inner sidewalls of each hole 89. A vertical center axis of each connection hole 89 may be formed to be the same as a vertical center axis of a corresponding landing pads 45. While the connection holes 89 are formed, the protection layer 104 may be removed from upper surfaces of the mask patterns 95, and may partially remain on surfaces of adjacent mask patterns 95 facing each other and in a sidewall of the connection hole 89, as illustrated in FIG. 6. When the device isolation region 6 defines three or more active regions 9, the connection holes 89 may be formed to correspond to the three or more active regions 9.

Next, as illustrated in FIG. 6, a plug layer 112 may be formed on the mask patterns 95 to fill the cavities 86 and connection holes 89. The plug layer 112 may include a different material from a protection layer 104. The plug layer 112 may include the same material as or a different material from the landing pads 45.

Figure 7:
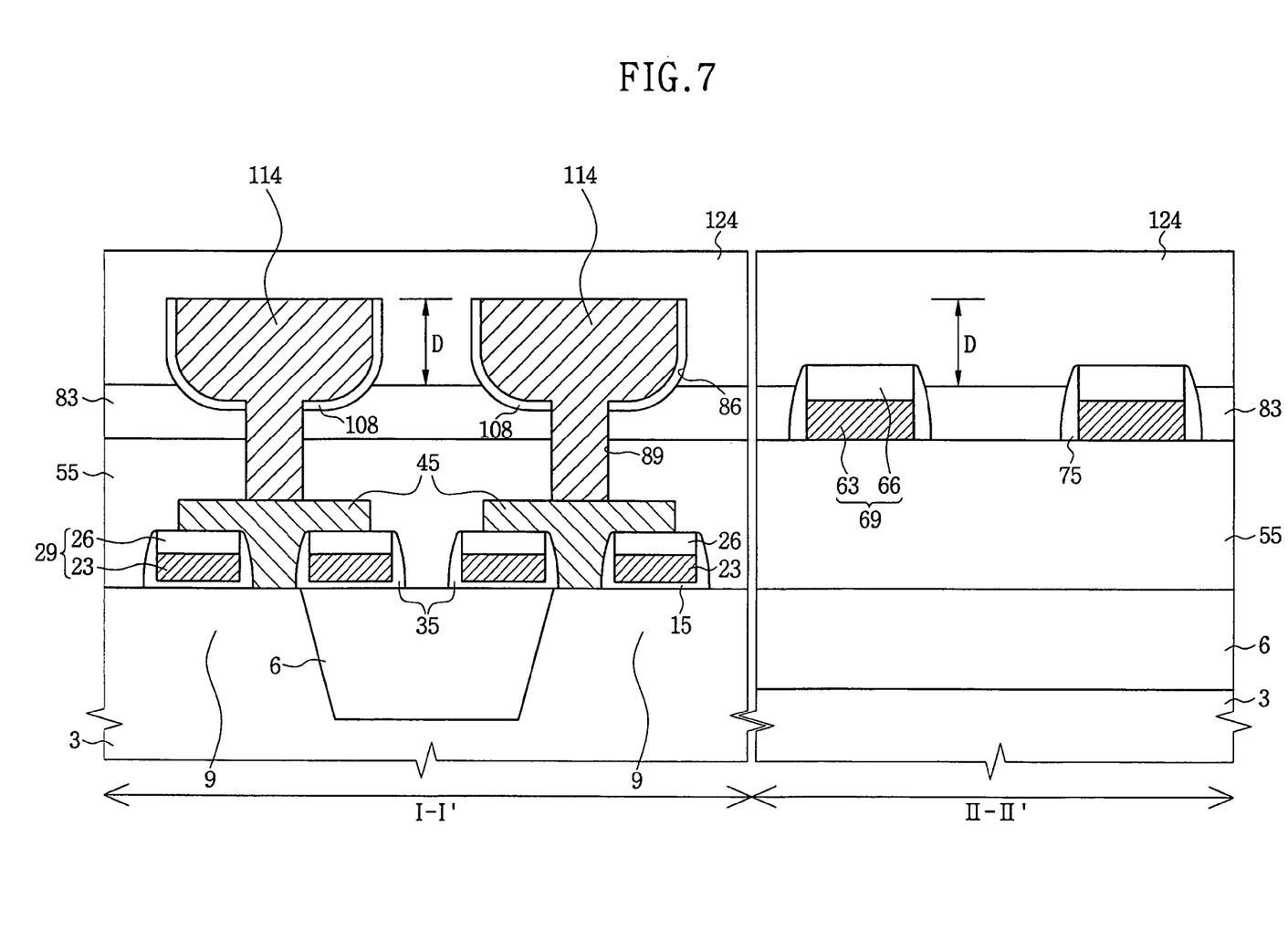

Referring to FIGS. 1 and 7, the plug layer 112 and the mask patterns 95 may be sequentially etched to remove portions of the protection layer 104 from lower surfaces of the mask patterns 95. The mask patterns 95, the protection layer 104, and the plug layer 112 may be etched using an etching-back technique or a chemical mechanical polishing (CMP) technique. As a result, plug patterns 114 may be defined in the cavities 86 and connection holes 89 through the first and second interlayer insulating layers 55 and 83, and the protection patterns 108 may be defined in the cavities 86, as illustrated in FIG. 7. When the device isolation region 6 defines three or more active regions 9, the protection patterns 108 and the plug patterns 114 may be formed to correspond to the three or more active regions 9.

The second interlayer insulating layer 83 may be partially etched to remove an upper portion thereof using the protection patterns 108 and the plug patterns 114 as an etch mask, as illustrated in FIG. 7. Accordingly, an upper surface of the second interlayer insulating layer 83 may be at a lower height than upper surfaces of the plug patterns 114 and protection patterns 108. In other words, the upper surface of the second interlayer insulating layer 83 may be closer to the semiconductor substrate 3 along the y-axis than the upper surfaces of the plug patterns 114 and protection patterns 108. A vertical distance, i.e., along the y-axis, between the upper surface of the second interlayer insulating layer 83 and upper surfaces of the plug patterns 114 may be defined as a predetermined depth D, as illustrated in FIG. 7.

Alternatively, after the mask patterns 95, the protection layer 104 and the plug layer 112 are etched, a mask layer (not shown) may be formed on the second interlayer insulating layer 83, the protection patterns 108 and the plug patterns 114. The mask layer may include a material, e.g., an insulating material and/or a conductive material, different from the second interlayer insulating layer 83. The mask layer may have an opening exposing a portion of the second interlayer insulating layer 83 on the device isolation layer 6 between adjacent plug patterns 114, so the second interlayer insulating layer 83 may be partially etched through the opening using the mask layer as an etch mask. As a result, the second interlayer insulating layer 83 may be etched to have the predetermined depth D between the upper surface thereof and the upper surfaces of the plug patterns 114. Continuously, the mask layer may be removed from the second interlayer insulating layer 83, the protection patterns 108 and the plug patterns 114.

Etching the second interlayer insulating layer 83, e.g., using a wet etchant or a dry etchant, to have the predetermined depth D between the upper surface thereof and the upper surfaces of the plug patterns 114 may define the upper surface of the second interlayer insulating layer 83 below upper surfaces of the upper interconnections 69, as illustrated in FIG. 7. In other words, a thickness of the second interlayer insulating layer 83 may be reduced by the predetermined depth D, i.e., relatively to the upper surfaces of the plug patterns 114, so a distance between the upper surface of the second interlayer insulating layer 83 and the semiconductor substrate 3 may be smaller than a distance between the upper surfaces of the upper interconnections 69 and the semiconductor substrate 3.

The second interlayer insulating layer 83 may be etched. i.e., thickness of the second interlayer insulating layer 83 may be reduced, to expose the first interlayer insulating layer 55 and the upper interconnections 69, e.g., the upper surfaces of the upper interconnections 69.

A filling layer 124 may be formed on the second interlayer insulating layer 83, so upper surfaces of the plug patterns 114 and upper interconnections 69 may be covered. The filling layer 124 may fill, e.g., completely fill, spaces between adjacent plug patterns 114, as illustrated in FIG. 7. For example, the filling layer 124 may include the same material as or a different material from the protection patterns 108.

Figure 8:
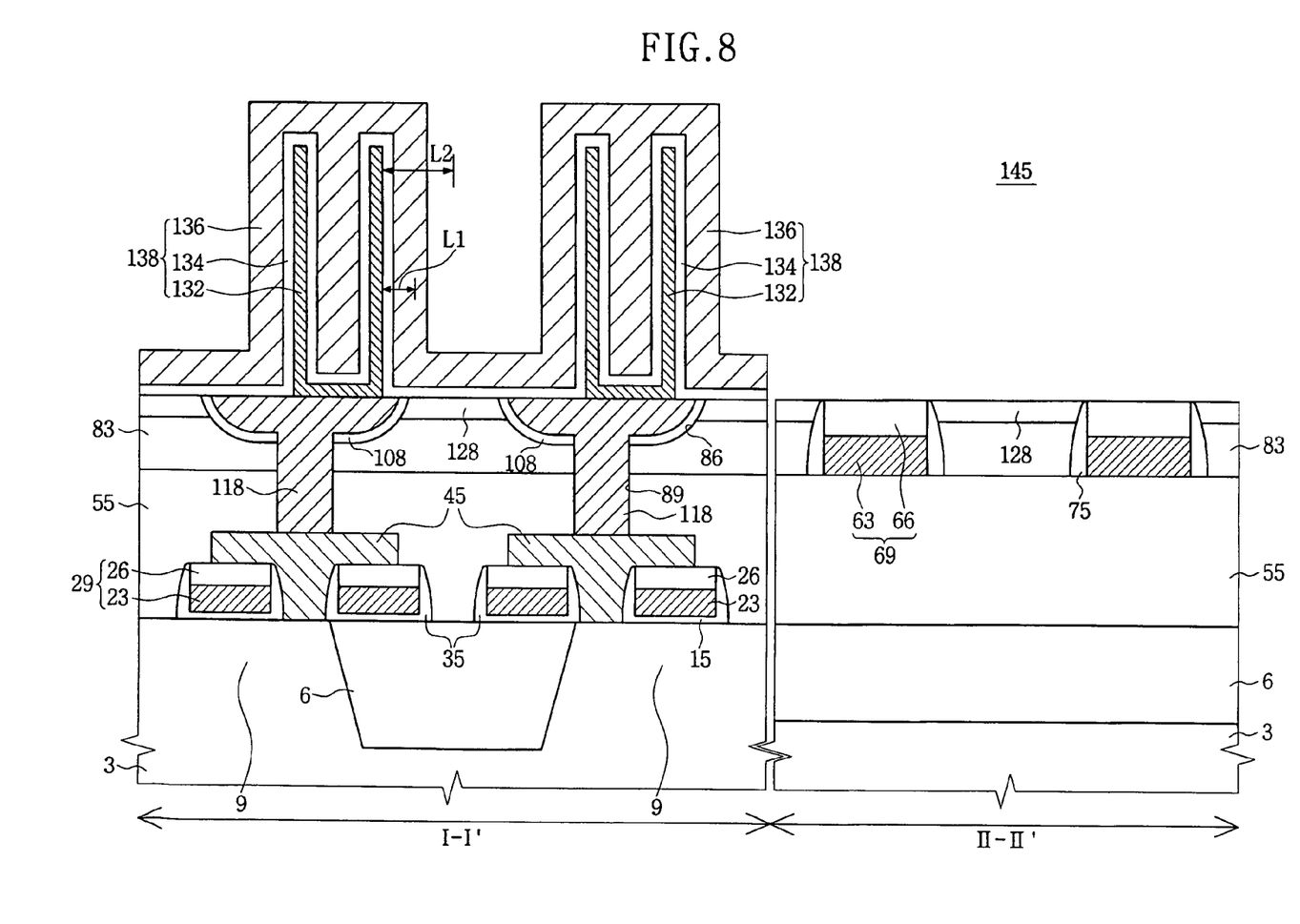

Referring to FIGS. 1 and 8, the filling layer 124 may be etched, e.g., using the etching-back technique or the CMP technique, to form a filling pattern 128 exposing upper surfaces of the upper interconnections 69, the protection patterns 108, and the plug patterns 114. During etching of the filling layer 124, an upper portion of the plug pattern 114 may be removed to form the plug 118. Accordingly, as illustrated in FIG. 8, the first and second interlayer insulating layers 55 and 83 may have plugs 118 in the cavities 86 and connection holes 89. For example, etching of the filing layer 124 may be adjusted, so upper surfaces of the filling pattern 128, protection patterns 108, and plug 118 may be substantially coplanar. In another example, etching of the filing layer 124 may be adjusted, so upper surfaces of the filling pattern 128, protection patterns 108, plug 118, and upper interconnections 69 may be substantially coplanar.

The second interlayer insulating layer 83 may have the filling patterns 128 thereon, e.g., portions of the filling patterns 128 may be between adjacent plugs 118, and the filling patterns 128 may overlap the lower interconnections 29 and the upper interconnections 69. When the device isolation region 6 defines three or more active regions 9, the filling patterns 128 may be formed to correspond to the three or more active regions 9.

Next, a structure 138 may be formed on the respective plugs 118 to be electrically connected thereto, as illustrated in FIG. 8. Centers of the structures 138, i.e., vertical center axes, may be spaced apart from those of the plugs 118, as illustrated in FIG. 8. Each of the lower electrodes 132 may have an alignment margin, i.e., a distance measured from a sidewall of the lower electrode 132 toward a lower electrode 132 of an adjacent structure 138 along the x-axis and providing sufficient distance to prevent a short circuit between the lower electrode 132 and an adjacent electrical element, e.g., the plug 118 and/or an upper interconnection 69.

Forming the semiconductor device 145 with the filling pattern 128 according to an example embodiment may provide a substantially larger alignment margin for the lower electrode 132 of the structure 138. For example, in a conventional semiconductor device having no filling pattern, a lower electrode may have an alignment margin L1, i.e., measured between the plug 118 and the lower electrode 132, adjusted to prevent a short circuit between the plug 118 and an adjacent upper interconnection 69. In the semiconductor device 145 according to an example embodiment, however, when the filling patterns 128 are interposed between the plugs 118, each of the lower electrodes 132 may have an alignment margin L2 longer than the length L1 to prevent a short circuit between adjacent lower electrodes 132. Further, each of the lower electrodes 132 may be formed to be spaced apart by a width of each filling pattern 128 from an adjacent upper interconnection 69, i.e., along a direction diagonally passing upper spacers 75 with respect to an upper surface of a semiconductor substrate 3. As a result, the structures 138 may form a semiconductor device 145 together with the lower interconnections 29, the landing pads 45, the upper interconnections 69, the protection patterns 108, the plugs 118 and the filling patterns 128.

As described above, an exemplary embodiment may provide a semiconductor device having a filling pattern around a storage structure and a method of forming the same. The storage structure may have a conductive material, a phase change material, ferromagnetic and paramagnetic materials, or a stacked material thereof to apply to a volatile or non-volatile device. The filling pattern may increase an alignment margin between the storage structure and a plug electrically connected thereto, thereby preventing a short circuit therebetween. Further, the filling pattern may separate the storage structure from an adjacent upper interconnection, thereby preventing a short circuit therebetween.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
an interlayer insulating layer on a semiconductor substrate;
at least one plug on the semiconductor substrate, the plug extending through the interlayer insulating layer toward an upper portion of the semiconductor substrate, the plug having a lower part with a first diameter and an upper part with a second diameter different from the first diameter;
a filling pattern on the interlayer insulating layer, the filling pattern surrounding the upper part of the plug, and an upper surface of the filling pattern being substantially coplanar with an upper surface of the plug, the upper surface of the plug facing away from the semiconductor substrate;
a protection pattern on the upper part of the plug, the protection pattern being between the plug and the filling pattern with the interlayer insulating layer; and
a storage structure on the plug and connected thereto, the storage structure being in contact with the plug and extending upward from the plug, a vertical center axis of the storage structure being horizontally spaced apart from a vertical center axis of the plug.

2. The device as claimed in claim 1, wherein the second diameter is larger than the first diameter, the plug including a conductive material and being electrically connected to the semiconductor substrate.

3. The device as claimed in claim 1, wherein the protection pattern and the filling pattern include a different insulating material from the interlayer insulating layer and the plug.

4. The device as claimed in claim 1, wherein the storage structure includes a conductive material, a phase change material, a ferromagnetic material, a paramagnetic material, or stacked layers thereof.

5. The device as claimed in claim 1, further comprising:
a lower interconnection on the semiconductor substrate, the lower interconnection being between the semiconductor substrate and the plug;
a landing pad between the plug and the lower interconnection, the landing pad being in contact with the semiconductor substrate and the lower interconnection; and
an upper interconnection above the lower interconnection and perpendicular thereto,
wherein the filling pattern overlaps the upper and lower interconnections, the upper interconnection, landing pad, and lower interconnection being covered with the interlayer insulating layer.

6. The device as claimed in claim 5, wherein upper surfaces of the upper interconnection and filling pattern are substantially coplanar.

7. The device as claimed in claim 5, wherein the filling pattern is between the storage structure and the upper interconnection.

8. The device as claimed in claim 5, wherein the landing pad includes a conductive material, and each of the lower and upper interconnections includes a conductive material and an insulating material, which are sequentially stacked.

9. The device as claimed in claim 1, further comprising a device isolation region defining at least one active region on the semiconductor substrate, the plug being electrically connected to the active region.

10. The device as claimed in claim 9, wherein the filling pattern overlaps the device isolation region and the at least one active region.

11. The device as claimed in claim 9, wherein the filling pattern is only on the device isolation region.

12. The device as claimed in claim 1, wherein, when the plug is a plurality of plugs, the filling pattern surrounds an upper part of each plug of the plurality of plugs.

13. The device as claimed in claim 12, wherein the protection pattern is directly on the upper part of each plug, the filling pattern extending between protection patterns of adjacent plugs and in direct contact therewith.

14. The device as claimed in claim 1, wherein upper surfaces of the filling pattern, plug, and protection pattern are substantially coplanar.

15. The device as claimed in claim 1, wherein the protection pattern is in direct contact with the plug, the filling pattern, and the interlayer insulating layer.

16. The device as claimed in claim 1, wherein the filling pattern surrounds an entire perimeter of the plug, the filling pattern overlapping only an upper section of the upper part of the plug.

17. The device as claimed in claim 1, wherein the filling pattern and the interlayer insulating layer include different materials.

* * * * *